(12) United States Patent
Matsuda et al.

(10) Patent No.: US 6,308,361 B1
(45) Date of Patent: Oct. 30, 2001

(54) CLEANING APPARATUS

(75) Inventors: Naoki Matsuda, Yokohama; Kenya Ito; Mitsuhiko Shirakashi, both of Fujisawa, all of (JP)

(73) Assignee: Ebara Corporation, Tokyo (JP)

( * ) Notice: Subject to any disclaimer, the term of this patent is extended or adjusted under 35 U.S.C. 154(b) by 0 days.

(21) Appl. No.: 09/361,244

(22) Filed: Jul. 27, 1999

(30) Foreign Application Priority Data

Jul. 28, 1998 (JP) .................................................. 10-227570

(51) Int. Cl.[7] ...................................................... B08B 1/04
(52) U.S. Cl. .................................................. 15/102; 15/77
(58) Field of Search .............................. 15/77, 88.2, 97.1, 15/102

(56) References Cited

U.S. PATENT DOCUMENTS

| 4,811,443 | * | 3/1989 | Nishizawa | 15/102 |
| 5,485,644 | * | 1/1996 | Shinbara et al. | 15/88.2 |
| 5,685,039 | * | 11/1997 | Hamada et al. | 15/77 |
| 5,858,112 | * | 1/1999 | Yonemizu et al. | 15/77 |
| 5,860,181 | | 1/1999 | Maekawa et al. | |
| 5,868,866 | | 2/1999 | Maekawa et al. | |
| 5,870,793 | * | 2/1999 | Choffat et al. | 15/202 |
| 5,975,094 | * | 11/1999 | Shurtliff | 15/77 |

FOREIGN PATENT DOCUMENTS 3-139832  6/1991  (JP).
09167746  6/1997  (JP).

* cited by examiner

Primary Examiner—Terrence R. Till
(74) Attorney, Agent, or Firm—Wenderoth, Lind & Ponack, L.L.P.

(57) ABSTRACT

A cleaning apparatus is suitable for cleaning workpieces that require a high degree of cleanliness, such as semiconductor wafers, glass substrates, or liquid crystal displays. The cleaning apparatus has a holding device for holding the substrate and a cleaning unit capable of slidably contacting the surface of the substrate. The cleaning unit has a nozzle for ejecting high-pressure cleaning liquid onto the substrate, and a cleaning member surrounding the nozzle.

14 Claims, 3 Drawing Sheets

F I G. 1
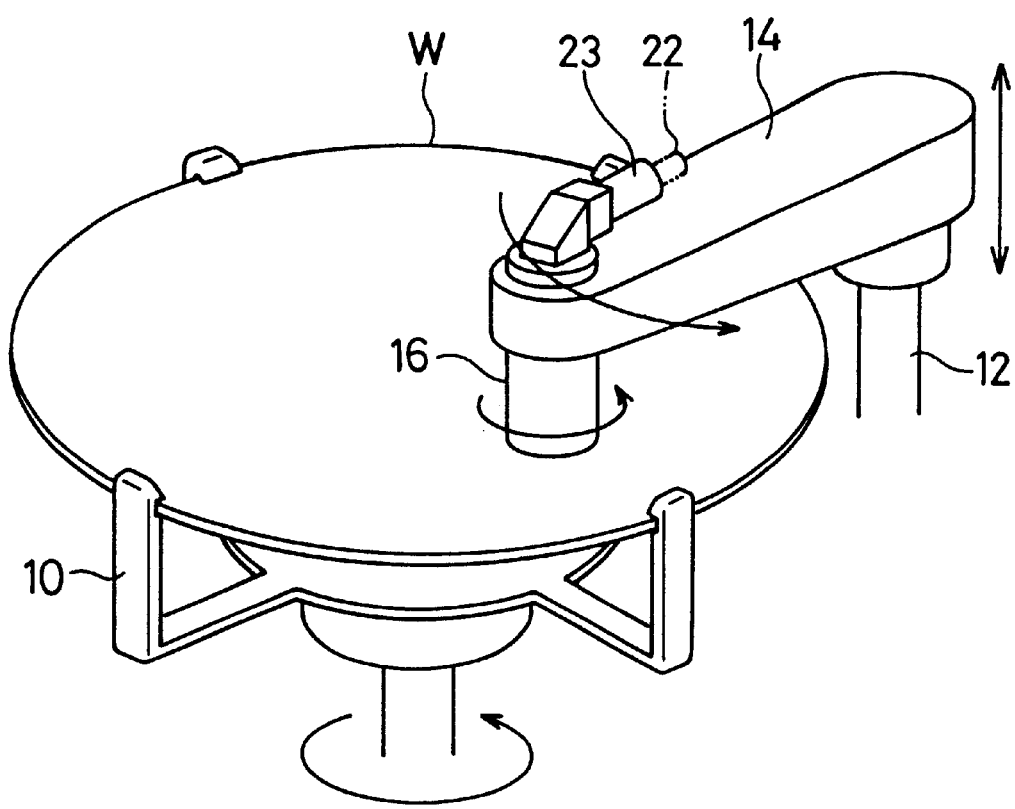

CLEANING APPARATUS

BACKGROUND OF THE INVENTION

1. Field of the Invention

The present invention relates to a cleaning apparatus, and more particularly to a cleaning apparatus suitable for cleaning substrates that require a high degree of cleanliness, such as semiconductor wafers, glass substrates, or liquid crystal displays.

2. Description of the Prior Art

As semiconductor devices have become more highly integrated in recently years, circuit interconnections on semiconductor substrates become finer and the distance between those circuit interconnections have become smaller. When semiconductor substrates are processed, small particles such as particles of semiconductor material, dust particles, or crystalline protrusive particles often tend to be attached to the semiconductor substrates being processed. If a particle greater than the distance between interconnections exists on a semiconductor substrate, then the particle will short-circuit interconnections on the semiconductor substrate. Therefore, any undesirable particles on a semiconductor substrate have to be sufficiently smaller than the distance between interconnections on the semiconductor substrate. Such problem and requirement hold true for the processing of other substrates, including a glass substrate to be used as a mask, a liquid crystal panel, and so on. To meet the above requirement, there have been practiced various cleaning procedures for removing fine particles or submicron particles from semiconductor substrates.

For example, as cleaning processes for cleaning semiconductor substrates which have been polished to a high degree of cleanliness, one practice has been to use a brush or a sponge to scrub a surface of a semiconductor substrate. This process is called a scrubbing cleaning process. Another practice has been a cavitation jet cleaning process in which high-pressure water (high speed jet stream) is projected onto the substrate to generate bubbles by cavitation. This process requires that low-pressure water should be supplied to the outer circumference of the high-pressure water to generate bubbles by cavitation.

Although the scrubbing cleaning process is effective in removing contaminants attached to the surface of the substrate, it is not always effective in removing fine particles deposited in fine grooves of the substrate surface. Further, as the amount of fine particles attached to the cleaning member increases, the particles are often reattached to the current substrate or the subsequent substrates in subsequent cleaning operations.

The cavitation jet cleaning process, on the other hand, is effective in removing fine particles deposited in the fine grooves formed in the substrate surface. However, the cavitation jet cleaning process requires that cleaning liquid should be supplied in two layers including an inner high-pressure layer and an outer low-pressure layer surrounding the inner high-pressure layer, resulting in a complicated structure. Thus, this process requires a large amount of cleaning liquid. In addition, the contaminants firmly attached to the substrate surface are difficult to be removed therefrom.

The above problems hold true for other cleaning processes. While most cleaning processes can satisfactorily clean either the substrate surface or the fine grooves in the substrate, none of them can satisfactorily clean both of the substrate surface and the fine grooves. For this reason, cleaning of semiconductor substrates has conventionally been performed in multiple steps or processes.

SUMMARY OF THE INVENTION

It is therefore an object of the present invention to provide a cleaning apparatus which can simultaneously clean both of a surface of a substrate and fine grooves in the substrate surface to a high degree of cleanliness and can prevent particles removed from the substrate from being reattached to the substrate.

According to one aspect of the present invention, there is provided a cleaning apparatus for cleaning a substrate. The apparatus comprises a holding device for holding the substrate, and a cleaning unit capable of slidably contacting the surface of the substrate. The cleaning unit comprises a nozzle for ejecting high-pressure cleaning liquid onto the substrate. A cleaning member surrounds the nozzle and contacts the surface of the substrate.

With the above structure, the lower end surface of the cleaning member contacts the surface of the substrate and is capable of sliding on the surface of the substrate, while supplying the cleaning liquid from the nozzle to the surface of the substrate. Therefore, the cleaning apparatus simultaneously performs a scrubbing cleaning and a high-pressure liquid cleaning of the substrate to thus effectively remove fine particles attached to the surface of the substrate and deposited in grooves formed in the surface of the substrate. The cleaning member forms a cover around the high-pressure cleaning liquid to prevent the cleaning liquid from absorbing static electricity or gas in the atmosphere. The cleaning member is a self-cleaning type in which the cleaning liquid supplied from the interior of the cleaning member prevents particles or other contaminants from building up on the cleaning member, thus reducing the chance of resoiling the current substrate or subsequent substrates to be cleaned.

The cleaning member is preferably fixed to the forward end of the swing arm that swings across the substrate while the holding device is rotated, and hence the amount of relative movement between the substrate and the cleaning member is large. Ultrapure water is preferably used as a cleaning liquid, and the cleaning member is made of material having a flexible property and a water absorbing property.

In a preferred aspect of the present invention, the cleaning liquid is ejected from the nozzle to the substrate at a pressure ranging from 5 to 10 MPa. With this arrangement, the cleaning member absorbs and holds the cleaning liquid therein, and an inner high-speed stream and an outer low-speed stream surrounding the inner high-speed are created. The great speed difference at the boundary face of these two streams generates cavitation bubbles that improve the cleaning ability of the cleaning liquid to remove particles.

According to another aspect of the present invention, there is provided a cleaning apparatus for cleaning a substrate, comprising a nozzle for ejecting high-pressure cleaning liquid onto the substrate and a hollow member surrounding the nozzle. The hollow member and the substrate define a space for storing the cleaning liquid ejected from the nozzle, and the high-pressure cleaning liquid ejected from the nozzle passes through the cleaning liquid stored in the space and impinges upon the surface of the substrate.

With the above structure, high-pressure cleaning liquid is ejected from the nozzle to the substrate, and thus the space defined by the hollow member and the substrate is filled with the cleaning liquid. The high-pressure cleaning liquid ejected from the nozzle passes through the cleaning liquid having static pressure and stored in the space, and hence a large speed difference exists at the boundary face where the high-pressure cleaning liquid ejected from the nozzle and the cleaning liquid having static pressure contact with each other. As a result, cavitation bubbles are generated.

The above and other objects, features, and advantages of the present invention will become apparent from the following description when taken in conjunction with the accompanying drawings which illustrate preferred embodiments of the present invention by way of example.

BRIEF DESCRIPTION OF THE DRAWINGS

FIG. 1 is a perspective view of a cleaning apparatus according to an embodiment of the present invention;

DETAILED DESCRIPTION OF THE PREFERRED EMBODIMENT

A cleaning apparatus according to a preferred embodiment of the present invention will be described with reference to the accompanying drawings.

FIG. 1 shows a whole structure of a cleaning apparatus according to the present invention. The cleaning apparatus has a spin chuck 10 for holding a semiconductor wafer W to be cleaned and rotating the semiconductor wafer W in a horizontal plane at a predetermined speed. The spin chuck 10 holds the semiconductor wafer W in such a state that the surface of the semiconductor wafer W to be cleaned is facing upward. A vertical support shaft 12 is disposed adjacent to the spin chuck 10 and supports at an upper end thereof a swing arm 14 extending horizontally. The support shaft 12 is vertically movable and rotatable about its own axis. A substantially cylindrical housing 16 is supported by the forward end of the swing arm 14.

Figure 2:
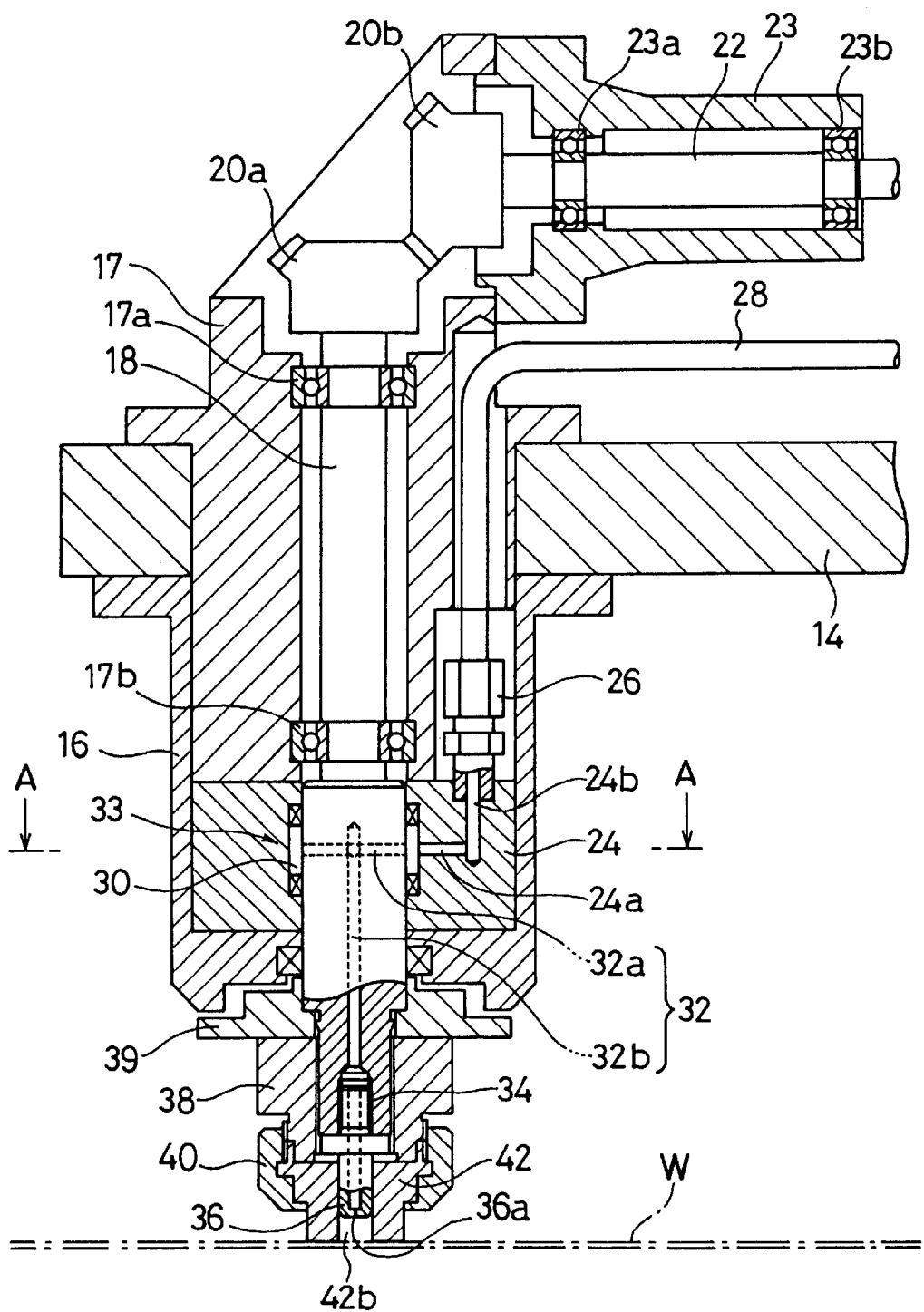
FIG. 2 is an enlarged cross-sectional view showing an essential part of the cleaning apparatus shown in FIG. 1.

As shown in FIG. 2, a bearing retaining member 17 is disposed in the housing 16 for retaining bearings 17a and 17b. A rotating shaft 18 extending vertically is rotatably supported by the bearings 17a and 17b. A driven bevel gear 20a is mounted on the top end of the rotating shaft 18. A bearing casing 23 is mounted on the upper portion of the bearing retaining member 17 for housing bearings 23a and 23b. A drive shaft 22 extending horizontally is rotatably supported by the bearings 23a and 23b. A drive bevel gear 20b which engages with the driven bevel gear 20a is mounted on the forward end of the drive shaft 22. The drive shaft 22 is coupled to a drive source (not shown) such as a motor provided in the base portion of the swing arm 14.

A ring member 24 is provided at the lower portion of the rotating shaft 18 so as to enclose the shaft 18. The ring member 24 has therein a flow passage 24a for allowing high-pressure water to flow therethrough. The flow passage 24a has an inlet 24b connected to a high-pressure water supply hose 28 via a joint 26. The high-pressure water supply hose 28 extends vertically in the housing 16, and further extends externally from the upper portion of the housing 16. A booster pump (not shown) such as a plunger pump is provided at a given portion of the high-pressure water supply hose 28 outside of the housing 16 for pressurizing water to a pressure of about 1 to 15 MPa (10 to 150 kgf/cm$^2$), preferably about 5 to 10 Mpa.

Figure 3:
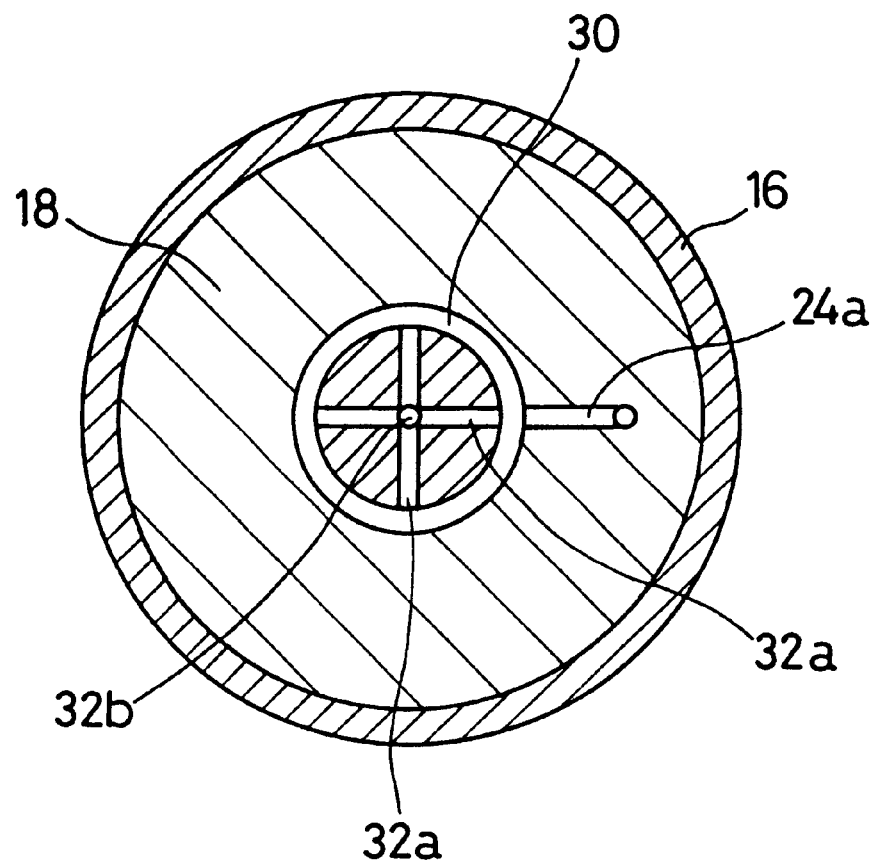
FIG. 3 is a cross-sectional view taken along line A—A of FIG. 2.

An annular liquid storage portion 30 is formed between the rotating shaft 18 and the ring member 24, and as shown in FIG. 3, radial flow passages 32a extending from the liquid storage portion 30 to an axis of the rotating shaft 18 are formed in the rotating shaft 18, thereby forming a rotary joint 33. The radial flow passages 32a communicate with an axial flow passage 32b extending downward from the radial flow passages 32a along the axis of the rotating shaft 18. Accordingly, there is provided a high-pressure flow passage 32 which comprises the radial flow passages 32a and the axial flow passage 32b and opens toward a high-pressure nozzle-mounting portion 34 in the lower end of the rotating shaft 18.

Figure 4A:
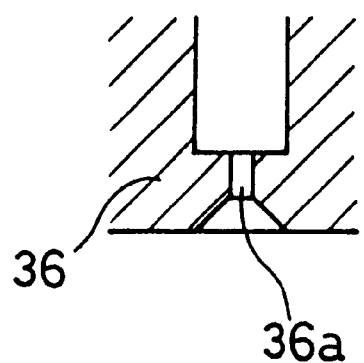
FIGS. 4A and 4B are enlarged cross-sectional views showing the lower end portions of the cleaning apparatus shown in FIG. 2, respectively.
Figure 4B:
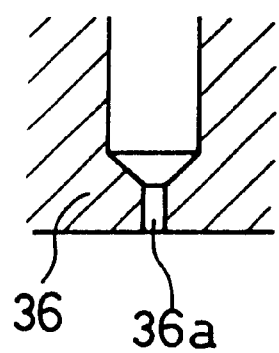

A high-pressure liquid nozzle 36 is fitted into the nozzle-mounting portion 34 by a screw engagement. The high-pressure liquid nozzle 36 includes a nozzle hole 36a having a small diameter. The nozzle hole 36a may be a jet nozzle type having a nozzle tip end spreading outwardly as shown in FIG. 4A, or a straight type having a straight nozzle tip end as shown in FIG. 4B. The diameter of the nozzle hole 36a is in the range of approximately 0.2 to 0.4 millimeters. If the diameter of the nozzle hole 36a is 0.2 millimeters, then the flow rate of high-pressure water is set to approximately 210 milliliters/minute.

A splash guard 39 is fixed to the lower end of the rotating shaft 18 through a sleeve 38 to prevent water splashing off the semiconductor wafer W from entering the interior of the housing 16. A cylindrical cleaning member 42 of PVA sponge or the like for performing a scrubbing cleaning is fixed to the lower end of the sleeve 38 by a nut 40 in such a manner that the cleaning member 42 surrounds the high-pressure liquid nozzle 36 and the forward end of the cleaning member 42 projects from the lower end of the high-pressure nozzle 36. The PVA sponge includes a series of minute holes that have excellent water absorbing properties, and is flexible and less likely to drop off than a fibrous member.

Next, the operation of the cleaning apparatus having the above structure will be described.

A semiconductor wafer W is transferred to the spin chuck 10 by a robot arm or the like. The semiconductor wafer W is held and rotated by the spin chuck 10 at a predetermined rotational speed. Next, the swing arm 14 is raised, and swung in its raised state over the substantial center of the semiconductor wafer W.

In this state, while the rotating shaft 18 is rotated to cause the cleaning member 42 to rotate as well, the swing arm 14 is lowered. Thus, the lower end of the cleaning member 42 is pressed against the surface of the rotating semiconductor wafer W at a given pressure. At the same time, cleaning liquid such as ultrapure water is ejected from the high-pressure liquid nozzle 36 onto the semiconductor wafer W at a pressure ranging from 1 to 15 MPa. Further, the swing arm 14 is swung a given times between diametrically opposite peripheral edges of the semiconductor wafer W such that the cleaning member 42 passes through the center of the semiconductor wafer W at a predetermined speed. Thus, the scrubbing cleaning and the high-pressure water cleaning are carried out simultaneously on the surface of the semiconductor wafer W.

Specifically, the high-pressure water supplied from the high-pressure liquid nozzle 36 impinges directly upon the semiconductor wafer W within the space surrounded by the cleaning member 42, thus removing particles from grooves formed in the wafer surface. The cleaning member 42 surrounds the high-pressure liquid nozzle 36 to thus prevent the water supplied from the high-pressure liquid nozzle 36 from absorbing gas in the atmosphere. Therefore, molecular contamination caused by the gas component can be prevented. Further, mist generated when cleaning with the high-pressure water is not discharged externally from the inner space defined by the cleaning member 42, and hence the dispersion of mist is prevented.

The high-pressure cleaning liquid is ejected from the high-pressure liquid nozzle 36 to the semiconductor wafer W, the lower end of the cleaning member 42 is brought in contact with the semiconductor wafer W, and thus the space 42b enclosed by the lower end of the high-pressure liquid nozzle 36, the inner circumferential surface of the cleaning member 42 and the surface of the semiconductor wafer W is filled with cleaning liquid such as ultrapure water. The high-pressure cleaning liquid ejected from the high-pressure liquid nozzle 36 passes through the cleaning liquid having static pressure and stored in the space 42b, and hence the large speed difference exists at the boundary face where the high-pressure cleaning liquid ejected from the high-pressure liquid nozzle 36 and the cleaning liquid having static pressure and stored in the space 42b contact with each other, thus causing friction therebetween. As a result, bubbles, i.e. cavitation bubbles are generated.

Even if the lower end of the cleaning member 42 does not contact the surface of the semiconductor wafer W but makes an approach to the surface of the semiconductor wafer W, the cavitation bubbles can be created. When the lower end of the cleaning member 42 makes an approach to the surface of the semiconductor wafer W, the distance between the surface of the semiconductor wafer W and the lower end of the cleaning member 42 is set so that the flow rate of the cleaning liquid flowing out through the gap between the lower end of the cleaning member 42 and the surface of the semiconductor wafer W is smaller than the flow rate of cleaning liquid supplied from the high-pressure liquid nozzle 36. The bubbles break on or near the surface of the wafer W after an elapse of a certain time to thereby enhance the ability for removing particles and the cleaning ability of the cleaning liquid.

In the cleaning apparatus of the present invention, by supplying the cleaning liquid from the interior of the cleaning member 42, fine particles attached to the cleaning member 42 are continuously removed. That is, the cleaning apparatus is a self-cleaning type in which the number of particles deposited on the cleaning member 42 is reduced and the danger of resoiling of the semiconductor wafer W is reduced.

After a cleaning process of a certain period of time finishes, the swing motion of the swing arm 14 and the supply of water are stopped, and then the swing arm 14 is raised and swung off the semiconductor wafer W. Thereafter, the spin chuck 10 is rotated at a high speed to spin-dry the semiconductor wafer W. However, if the semiconductor wafer W is subject to another cleaning process, the rotation of the spin chuck 10 is stopped and the semiconductor wafer W is conveyed to the subsequent process while preventing drying of the surface of the semiconductor wafer W.

In the above embodiment, although ultrapure water is used as a cleaning liquid, chemicals such as aqueous ammonia or dilute hydrofluoric acid, or ozone pure water may be used to remove contaminant on the semiconductor wafer by the combination of chemical cleaning action and mechanical cleaning action by cavitation.

Further, as a cleaning liquid, liquid which is produced by adding material which ionizes in water to ultrapure water to thereby lower resistivity, such as carbon dioxide dissolution pure water may be used. By using this kind of liquid, the quantity of static electricity generated when high-pressure liquid collides with the substrate is reduced, and hence electrostatic breakdown of the circuit on the substrate or particle adhesion may be prevented.

As described above, according to the present invention, the surface of the substrate and the grooves in the substrate can be simultaneously cleaned through the parallel operations of scrubbing cleaning and high-pressure water cleaning. Further, by supplying water from the interior of the cleaning member, contaminants are prevented from accumulating on the cleaning member itself, and reattachment of particles to the substrate caused by dense contamination of the cleaning member is prevented. Thus, the cleaning apparatus of the present invention is capable of performing cleaning of the substrate to a high degree of cleanliness.

Although certain preferred embodiments of the present invention have been shown and described in detail, it should be understood that various changes and modifications may be made therein without departing from the scope of the appended claims.

What is claimed is:

1. A cleaning apparatus for cleaning a substrate, comprising
   a holding device for holding the substrate;
   a nozzle for ejecting high-pressure cleaning liquid onto the substrate; and
   a hollow member surrounding said nozzle and having a forward end projecting from a lower end of said nozzle;
   wherein said cleaning liquid has a pressure in a range of 1 to 15 Mpa.

2. A cleaning apparatus according to claim 1, wherein said nozzle is slidably movable between diametrically opposite edges of the substrate.

3. A cleaning apparatus according to claim 1, wherein said holding device comprises a spin chuck for holding the substrate in a substantially horizontal plane.

4. A cleaning apparatus according to claim 1, wherein said hollow member contacts the surface of the substrate.

5. A cleaning apparatus according to claim 4, wherein said hollow member performs scrubbing cleaning of the substrate and said nozzle performs high-pressure liquid cleaning of the substrate.

6. A cleaning apparatus according to claim 1, wherein said hollow member is made of a material capable of absorbing said cleaning liquid.

7. A cleaning apparatus according to claim 6, wherein said hollow member is made of sponge.

8. A cleaning apparatus for cleaning a substrate, the cleaning apparatus comprising:
   a nozzle for ejecting high-pressure cleaning liquid onto the substrate; and
   a hollow member surrounding said nozzle, such that said hollow member and the substrate define a space for storing the cleaning liquid ejected from said nozzle, so that said high-pressure cleaning liquid ejected from said nozzle generates cavitation bubbles by passing through said cleaning liquid stored in said space.

9. A cleaning apparatus according to claim 8, further comprising a holding device for holding the substrate.

10. A cleaning apparatus according to claim 8, further comprising a sliding mechanism for sliding said nozzle against the surface of said substrate.

11. A cleaning apparatus according to claim 10, wherein said sliding mechanism moves said nozzle between diametrically opposite edge of the substrate.

12. A cleaning apparatus according to claim 8, wherein a distance between the surface of the substrate and the lower end of the hollow member is set so that a flow rate of the cleaning liquid flowing out through the gap between the lower end of the hollow member and the surface of the substrate is smaller than the flow rate of the cleaning liquid supplied from the high-pressure liquid nozzle.

13. A cleaning apparatus according to claim 8, wherein said hollow member comprises a cleaning member that contacts the surface of the substrate.

14. A cleaning apparatus for cleaning a substrate, the cleaning apparatus comprising:

a nozzle for ejecting high-pressure cleaning liquid onto the substrate; and a hollow member surrounding said nozzle;

wherein said hollow member and the substrate define a space for storing the cleaning liquid ejected from said nozzle having a structure such that when said hollow member is positioned to clean the substrate and said high-pressure cleaning liquid is ejected from said nozzle, said high-pressure cleaning liquid becomes stored in said space and then generates cavitation bubbles by passing through said cleaning liquid stored in said space.

\* \* \* \* \*